United States Patent [19]
Rybicki et al.

[11] Patent Number: 5,777,522
[45] Date of Patent: Jul. 7, 1998

[54] ELECTRONIC DEVICE FOR CONTROLLING A REACTANCE VALUE FOR A REACTIVE ELEMENT

[75] Inventors: Mathew A. Rybicki, Austin; Michael D. Cave, Pflugerville, both of Tex.

[73] Assignee: Motorola, Inc., Schaumburg, Ill.

[21] Appl. No.: 775,991

[22] Filed: Jan. 3, 1997

[51] Int. Cl.[6] .................... H03L 7/00; H03B 5/20; H03B 1/00

[52] U.S. Cl. .................. 331/36 R; 331/135; 331/158; 331/117 R

[58] Field of Search ............... 331/36 R, 116 FE, 331/135, 177 R, 158

[56] References Cited

U.S. PATENT DOCUMENTS

| | | | |
|---|---|---|---|
| 3,614,649 | 10/1971 | Gerig | 331/71 |
| 4,234,858 | 11/1980 | Gomi | 331/177 |
| 4,583,059 | 4/1986 | Konno | 331/158 |
| 4,916,412 | 4/1990 | Nordholt et al. | 331/34 |
| 5,030,926 | 7/1991 | Walden | 331/116 |
| 5,596,301 | 1/1997 | Rybicki et al. | 331/177 R |

OTHER PUBLICATIONS

Rybicki et al., Application No. 08/435,104 filed May 4, 1995.

Paul R. Gray, et al., "Anaylsis and Design of Analog Integrated Circuits —3rd Edition", pub. by John Wiley & Sons, Inc., Canada 1993, Chapter 9.42 Methods of Compensation, pp. 612–621.

Primary Examiner—David C. Nelms
Assistant Examiner—Trong Phan
Attorney, Agent, or Firm—J. Gustav Larson; Keith E. Witek

[57] ABSTRACT

A capacitor (200) having an actual physical capacitance value of Cact and is coupled to an oscillator (36). The oscillation frequency of the oscillator (36) can be changed by changing the effective capacitance of the capacitor (200). The actual capacitance (Cact) of capacitor (200) can be altered to appear to be any effective capacitance (Ceff) between zero and a value much greater than Cact by using a Miller effect. In order to alter the effective capacitance of the capacitor (200), a representation of the output osculation signal (16) is provided to a frequency adjust stage (22). The frequency adjust stage either passed the signal (16) with 0° phase shift or with 180° phase shift. In addition to shifting the phase, the stage (22) will amplify or attenuate the signal (16) to result in the phase shifted and amplified/attenuated frequency adjusting signal (24). By providing the signals (16 and 24) to opposite ends of the capacitor (200), Miller affect will alter the effective capacitance of the capacitor (200) thereby altering a frequency of the oscillator (36).

31 Claims, 5 Drawing Sheets

$$C_{EFF} = C_{ACT}(1-n) \quad 0 \leq n \leq 1$$

FIG.7

$$C_{EFF} = C_{ACT}(1+n) \quad n \geq 0$$

FIG. 8

ELECTRONIC DEVICE FOR CONTROLLING A REACTANCE VALUE FOR A REACTIVE ELEMENT

CROSS REFERENCE TO RELATED COPENDING APPLICATIONS

This application is related to our commonly assigned copending patent application entitled "Apparatus for a Synthesized Reactance Controlled Oscillator Usable in a Phase Locked Loop" by Mathew A. Rybicki et al., application No. 08/435,104 and filed on Apr. 5, 1995.

FIELD OF THE INVENTION

This invention relates generally to oscillator circuits, and more specifically to a method and apparatus for controlling such oscillator circuits using Miller effect on a physical capacitor.

BACKGROUND OF THE INVENTION

Oscillation circuits are known to be used in phase locked loop circuits (PLLs) and enable the PLL to generate precise frequency outputs based on a given reference signal frequency. As is also known, PLLs are used in a wide variety of applications that require accurate synchronization between clock signals. For example, processing circuits (i.e., digital signal processors, microprocessors, microcomputers, microcontrollers, etc.) use PLLs to ensure synchronization of circuit elements, such as clocked flip-flops and latches. Wireless communication devices (such as mobile radios, cellular telephones, and transmission sites) also use PLLs to ensure proper tuning of transmitters and receivers such that a wireless communication can occur at a proper frequency. Data recovery systems, such as Asynchronous Transfer Mode (ATM), Asymmetrical Digital Subscriber Line (ADSL), and Integrated Services Digital Network (ISDN), use PLLs to recover clock signals from incoming data streams.

PLLs generally produce an output frequency based on some multiple of the reference signal frequency via a phase-detect stage, a voltage controlled oscillator, and a feedback stage. The phase-detect stage compares the reference signal frequency to an internally generated feedback oscillation signal and generates a frequency adjusting signal based on the phase relationship of these two signals. This frequency adjusting signal regulates the output frequency signal produced by the voltage controlled oscillator (VCO), wherein the output frequency signal is divided by the feedback stage to produce the feedback oscillation signal. As the reference signal frequency changes, the phase-detect stage detects the change and adjusts the frequency adjusting signal such that the output frequency signal remains "locked" with the reference signal frequency in a feedback loop manner.

Figure 1:
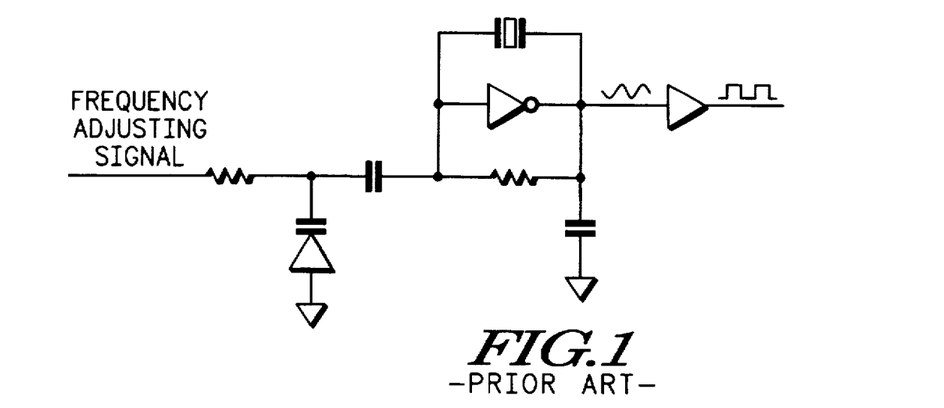
FIG. 1 illustrates, in a schematic diagram, a prior-art circuit for controlling an oscillator using a varactor.

One prior-art VCO is shown in FIG. 1 to include a varactor, a first capacitor, an inverter, a crystal, a second capacitor, an output buffer, and two resistors. In operation, the output frequency, which is provided at the output of the buffer, is adjusted based on the frequency adjusting signal. The frequency adjusting signal varies the capacitance of the varactor, thereby changing the capacitive load at the oscillator, causing the output frequency to be adjusted. While this type of VCO works well for typical supply voltages (5 volts), it does not support low voltage applications (supply voltages less than 3 volts) due to limitations of the varactor. In addition, the varactor cannot be integrated onto an integrated circuit (IC) using current technology so that varactors are usually an external component from the IC which requires connection to external pins of the IC. In addition, varactors are very expensive devices, and can significantly increase the cost of any design in which they are used.

Figure 2:
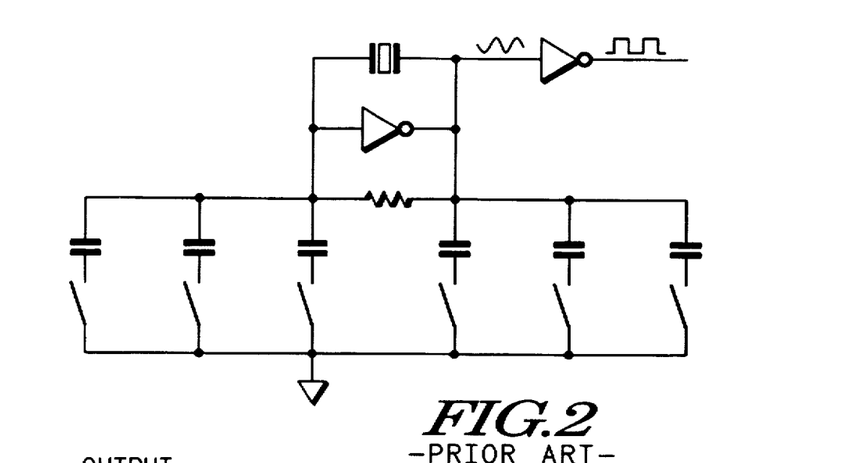
FIG. 2 illustrates, in a schematic diagram, a prior-art circuit for controlling an oscillator using digital switches.

A second type of VCO is shown in FIG. 2. In this implementation, the frequency is digitally adjusted by controlling a series of switching elements, each with an associated capacitor, to change the capacitance at the oscillator. As switching elements are selectively turned either on or off, the value of their associated capacitors is respectively added or subtracted to the oscillator node to enable a variable capacitance node. As with the varactor implementation, this change in capacitance causes the output frequency to change. One problem with the implementation of FIG. 2 is that the output frequency can only be changed in discreet non-analog steps due the step changes of the capacitance values, resulting in a loss of accuracy. A second problem with the implementation of FIG. 2 is that a large amount of space is required for the many capacitors whereby some or many of the capacitors may not be used. This overhead of many capacitors also affects system costs since capacitors can consume significant substrate surface areas.

Therefore, a need exists for an oscillator, which may be incorporated in a PLL or other electronic application, that can operate with a high degree of accuracy at low voltages, without utilizing unnecessary space in a cost effective manner.

DETAILED DESCRIPTION OF THE DRAWINGS

Generally, the present invention provides a method and apparatus for controlling an oscillator. This is accomplished by providing a reactive component, such as a capacitor or inductor, that is coupled to one terminal of the oscillator. The terminal common to the reactive element and the oscillator oscillates in response to the presence of a crystal oscillator. The reactive element, which is preferably a capacitor, is also coupled to a frequency adjust stage. The frequency adjust stage receives a representation of the oscillating output of the oscillator. The frequency adjust stage can change both the amplitude and phase of the representation of the oscillating output signal from the oscillator. Specifically, the frequency adjust stage can provide the output at a 0° phase or at a 180° phase with respect to the input. In addition to the in-phase or out-of-phase selection made for the output of the frequency adjust stage, the frequency adjust stage can change the amplitude of the output in comparison to the input. This output of the frequency adjust stage is applied to the second terminal of the reactive component. Therefore, the first terminal of the reactive element is exposed to the oscillating signal from the oscillator while the second terminal of the reactive component is exposed to a phase shifted (one of either 0° phase or 180° phase) and amplified/ attenuated version of the signal exposed to the first terminal of the reactive component. Therefore, the voltage difference across the reactive element is adjusted by the frequency adjust stage so that Miller effect results in the effective reactance of the reactive component and can be dynamically altered in a wide range to affect the operation of the oscillator in a feedback manner.

This Miller effect method and apparatus for controlling the oscillator works at low voltages, has a small surface area, is cost effective, can be used in a variety of applications, and is easily integrated onto any integrated circuit.

Figure 3:
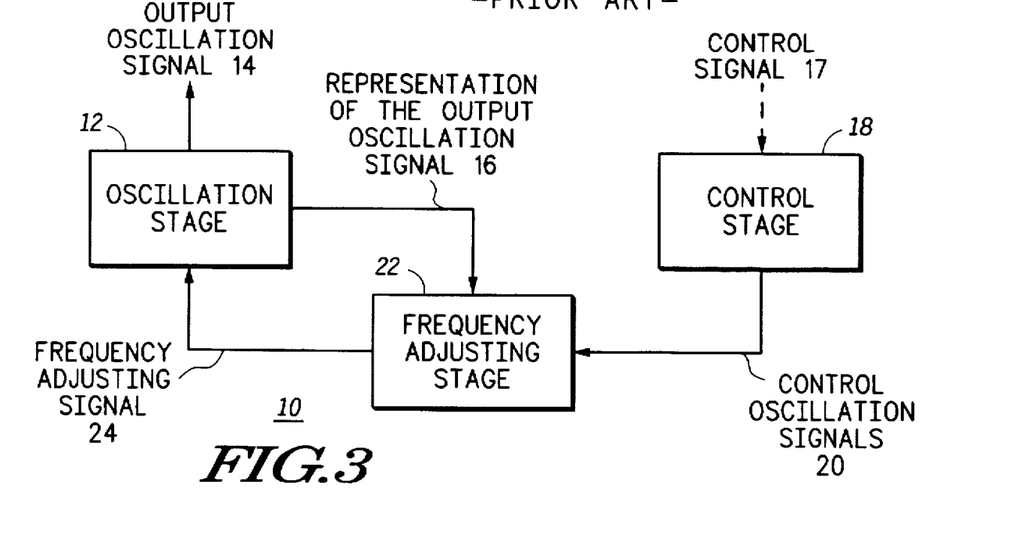
FIG. 3 illustrates, in a block diagram, a circuit for controlling an oscillator in accordance with the present invention.

FIG. 3 illustrates a controlled oscillator circuit 10 that includes an oscillation stage 12, a control stage 18, and a frequency adjusting stage 22. In operation, the oscillation stage 12 generates an output oscillation signal 14, and a representation of the output oscillation signal 16. Generation of the representation of the output oscillation signal 16 will be discussed below with reference to FIGS. 4 and 5. The representation of the output oscillation signal 16 may be an analog or digital signal or may be both an analog representation (provided to the frequency adjust stage 22) and a digital representation (provided to a digital signal processor (DSP) {not illustrated in FIG. 3} which controls the operation of the control stage 18). The signals 14 and 16 typically includes at least a sinusoidal component. For example, the representation of the output oscillation signal 16 may be a pure sinusoidal, a square wave which is the combination of a plurality of sinusoids or some combination thereof. Additionally, the representation of the output oscillation signal 16 may be phase shifted from the output oscillation signal 14.

Figure 4:
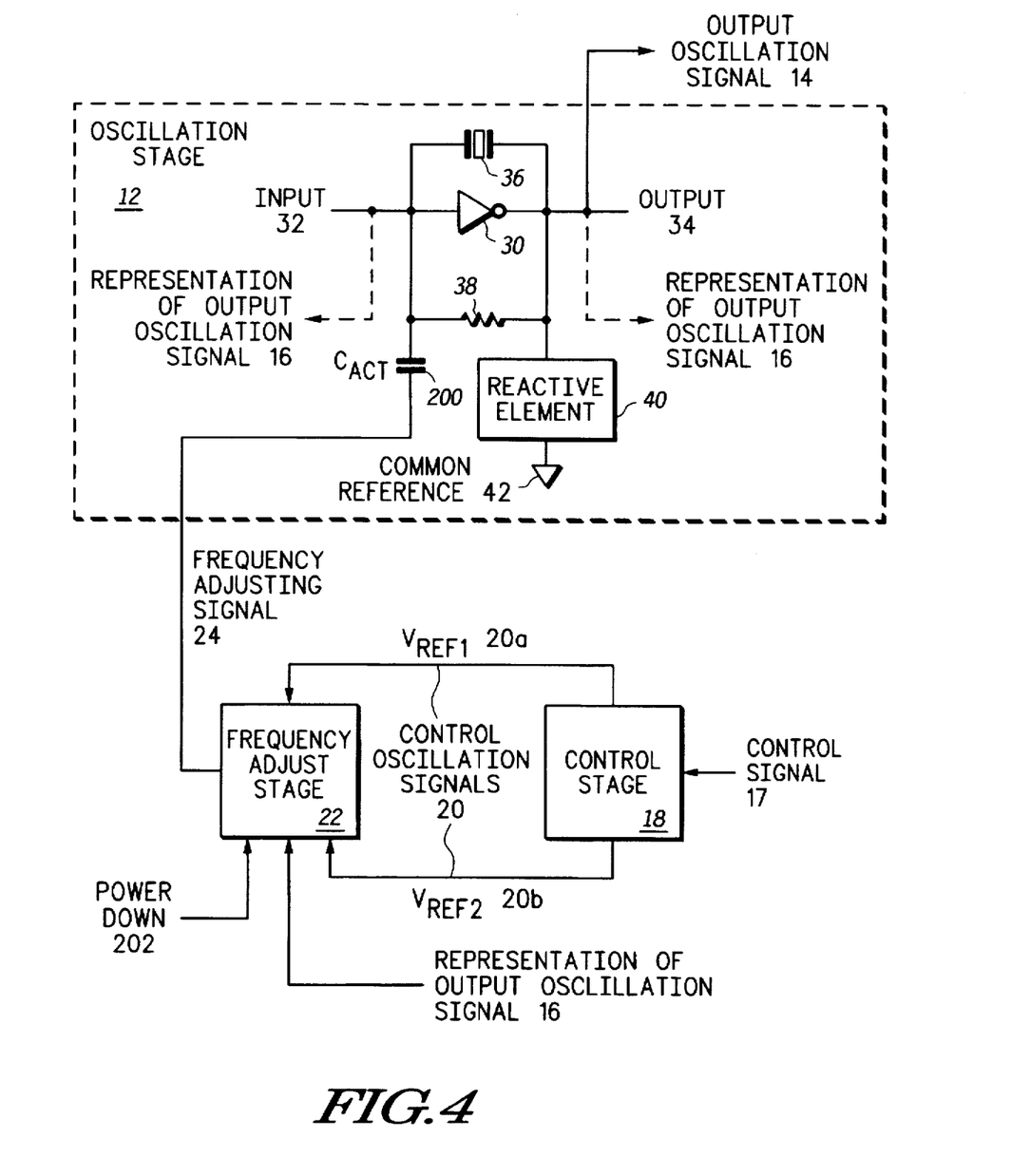
FIG. 4 illustrates, in block diagram and schematic diagram form, a circuit for controlling an oscillator in accordance with the present invention.

A digital signal processor (DSP) (not illustrated in FIG. 3) is used to monitor the a digital representation of one or more of signals 14 and 16 to control the control stage via a control signal 17. The control stage 18 generates oscillation control signals 20 therefrom. The oscillation control signals 20 are preferably two voltage supply signals Vref1 and Vref2 as illustrated in FIG. 4. The polarity of these two voltages (Vref1 and Vref2) and their magnitudes control the Miller effect which is used within the frequency adjust stage 22 to control the oscillation stage 12. In other words, the oscillation control signals 20 (Vref1 and Vref2) are set to alter the phase (preferably one of either approximately 0° phase or approximately 180° phase is selected) and amplitude of the signal 16 and provide this phase/amplitude altered signal as the frequency adjust signal 24. Note that while phase shifts of 0° and 180° are preferable, it is understood that other phase variations can be used.

Therefore, the frequency adjusting signal 24 is essentially a phase and magnitude altered version of the signal 16. A capacitor which is exposed to both the signal 16 and the signal 24 can be altered in effective capacitance through use of the Miller effect.

In a digital signal processor (DSP) embodiment, each of the signals 14, 16, 20, and 24, would be represented by mathematical equations. As is widely known, an analog signal can be represented digitally by performing a Fourier transform on the digitized analog signal. Once the analog signal is represented digitally, it can be scaled or phase shifted by performing shift left, shift right, or inversion operations. Therefore, various signals taught herein may be either digital or analog or changed there between during processing without changing the functional purpose of various circuitry or signals.

FIG. 4 illustrates a detailed version of the oscillation stage 12 from FIG. 3. In this embodiment, the oscillation stage 12 comprises an oscillator 36, an inverter 30, a resistor 38, a reactive element 40 (typically a capacitor), a common reference 42, and a capacitor 200 which is altered in effective capacitance via the Miller effect. The oscillator 36, inverter 30, and resistor 38 are coupled in parallel to provide an output oscillation signal 14, which has a sinusoidal component, at the output of the inverter 30. The reactive element 40, which may be a capacitor, inductor or a combination of one or more capacitors and/or inductors, is connected to the output of the inverter 30 and the common reference 42 (typically a ground voltage supply or Vss). The values of the components 36, 38, and 40 will depend on the desired output frequency and the range of frequency adjustment. For example, where a 15 mega-hertz (MHz) crystal is used, one skilled in the art would typically choose the resistor 38 value to be between 1 mega-ohm and 10 mega-ohm, and the reactive element 40 to be a capacitor with a value between 10 pico-farad and 30 pico-farad. Therefore, resistor 38 is typically in the mega-ohm range and the element 40 is typically a capacitor within the pico-farad range. In addition, the capacitor 200 is typically a capacitor within the pico-farad range. Alternatively, the capacitor 200 can be replaced with an inductor or a set of two or more inductors and/or capacitors.

The oscillator circuit 12 produces the output oscillation 14 and the representation of the output oscillation signal 16. As shown, the output oscillation 14 is provided at the output of the inverter 30, while the representation of the output 34 oscillation signal 16 may be provided by either the input 32 or the output 34 of the inverter 30. Using the input 32 or the output 34 is a designer's choice based on the desired phasing of the representation of the output oscillation 16. Preferably, the signal 16 is taken from the output 34 of FIG. 4 due to the drive capability of inverter 30 and the fact that the input 32 is sometimes more sensitive to loading.

The frequency of the output oscillation signal 14 is varied based on the frequency adjusting signal 24, which is being supplied by the stage 22. The frequency adjusting stage 22 receives a first power supply reference Vref1 (signal 20a) and a second power supply reference Vref2 (signal 20b) as illustrated in FIG. 4. The frequency adjusting stage 22 also receives the signal 16 from oscillation stage 12 as illustrated in FIG. 4. A power down signal 202, when asserted, will place the stage 22 in a low-power mode whereas, when deasserted, the power down signal 202 enables the operation of the frequency adjust stage 22.

The control stage 18 provides the signals Vref1 and Vref2. The affect of signals Vref1 and Vref2 on the operation of the frequency adjusting stage 22 is dependent upon whether the representation of the output oscillation signal 16 is tapped from output 34 or input 32 in FIG. 4. In either case, in a preferred form, Vref1 is preferably a voltage between 0 volts and 3.3 volts and Vref2 is (3.3v–Vref1) (i.e., the sum of Vref1 and Vref2 is equal to 3.3v). In other embodiments, the two reference voltages Vref1 and Vref2 may be totally independent of each other. When Vref1–Vref2 is positive, a first phase, either 0° or 180°, is selected where the "phase" indicates the time shift between signals 16 and 24 of FIG. 4. When Vref1–Vref2 is negative, the other phase, either 0° phase or 180°, is selected. Since the signal 16 and the signal 24 will have the same frequency, the value of Vref1–Vref2 at any point in time will be a value n that is constant over time. This value of n can be any real number and is the amount of amplification or attenuation by which the effective capacitance of capacitor 200 will be affected via the Miller effect.

In a preferred form, the control stage 18 provides the signals Vref1 and Vref2 via digital control signal 17 from a digital signal processor (DSP) (not illustrated in FIG. 4). The DSP will write or provide digital information to the control stage 18 to change one or more digital control values. These one or more digital control values then undergo digital-to-analog (D/A) conversion to provide the power supply voltages Vref1 and Vref2.

Figure 5:
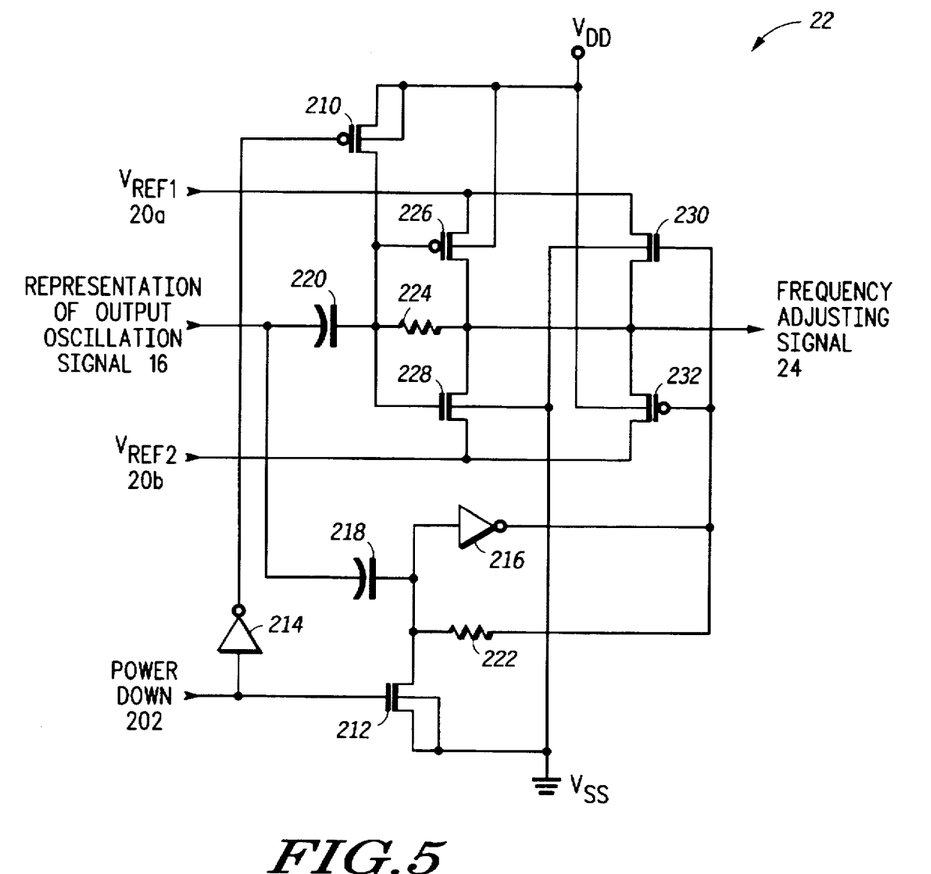
FIG. 5 illustrates, in a circuit schematic diagram, a frequency adjust stage which uses Miller effect to change the effective capacitance of a physical oscillator capacitance to control the frequency of the oscillator in accordance with the present invention.

FIG. 5 illustrates the frequency adjust stage of FIGS. 3 and 4 in more detail. The circuit of FIG. 5 accepts as input the signal 16 to provide as output the signal 24 which enables Miller effect control of the effective capacitance of capacitor 200 of FIG. 4. FIG. 5 illustrates the frequency adjusting stage 22 of FIG. 4 in more detail. Therefore, FIG. 5 illustrates the power down input 202, the voltage reference 20b (VREF2), voltage reference 20a (VREF1), the signal 16, and the output signal 24. In addition to these signals, an integrated circuit power supply $V_{dd}$ and an integrated circuit (IC) power supply $V_{ss}$ is illustrated. In a preferred form, $V_{ss}$ is equivalent to 0V or ground (GND)whereas $V_{dd}$ is set to 3.3V or less. The voltages Vdd and Vss are typically static and substantially non-changing when the IC is functional.

FIG. 5 illustrates a transistor 210 and transistor 212. The transistor 212 is directly coupled to the power down signal 202. The transistor 210 is coupled to the power down signal 202 through an inverter 214 as illustrated in FIG. 5. When the power down signal 202 is asserted, the circuitry of FIG. 5 is set into a static low power state. This static low power state is achieved by enabling the transistors 210 and 212. When in a functional mode of operation, the transistors 210 and 212 are disabled via a deasscerted power down signal 202.

FIG. 5 illustrates two capacitors 218 and 220. The capacitor 218 AC couples the oscillation signal 16 to the resistor 222, transistor 212, and the inverter 216 and DC decouples signal 16 from the inverter 216, transistor 212, and the resistor 222. Likewise, capacitor 220 AC couples the signal 16 to the transistors 210, 226, 228, and the resistor 224. In addition, the capacitor 220 DC decouples the signal 16 from the transistors 210, 226, 228, and resistor 224. Resistor 222 biases the inverter 216 at a trip point of the inverter 216. The trip point is a point on the Vout/Vin voltage transfer curve of the inverter where the voltage gain is high. Typically, the DC Vout of an inverter at a trip point is roughly 0.5(Vdd–Vss). The resistor 224 biases the inverter which is formed via the transistors 226 and 228 at its inverter trip point.

Transistors 226 and 228 create an inverter when Vref1 20a is at a greater potential than Vref2 20b. Transistors 230 and 232 create a buffer when Vref1 20a is at a greater potential than Vref2 20b. (the buffer is simply a Complementary Metal Oxide Semiconductor (CMOS) inverter with the P and N channel transistors swapped). Note, that as part of the present invention, to be discussed below, Vref1 20a does not need to have a greater potential than Vref2 20b.

When this is the case, it is not accurate to call transistors 226 and 228 an inverter, however, for ease of discussion and consistency, the term inverter for transistors 226 and 228 and the term buffer for 230 and 232 will be maintained. The transistors 210, 226, and 232 have a bulk connection to the $V_{dd}$ terminal. The transistors 212, 228, and 230 have a bulk connection to the $V_{ss}$ terminal of FIG. 5.

When the signal Vref1 is set to a voltage greater than the signal Vref2 of FIG. 5, the inverter comprising transistors 226 and 228 are strong compared to the buffer comprising transistors 230 and 232. The inverter is strong because for an input signal having an amplitude equal to the Vref1 and Vref2 potentials, the buffer's drive strength is less than the inverter's drive strength. This allows the frequency adjusting signal 24 of the device 22 to be driven rail-to-rail.

In a similar manner, when the signal Vref2 is set to a voltage greater than the signal Vref1 of FIG. 5, the inverter comprising transistors 230 and 232 are strong compared to the buffer comprising transistors 226 and 228. The buffer is strong because for an input signal having an amplitude equal to the Vref1 and Vref2 potentials, the inverter's drive strength is less than the buffer's drive strength. This allows the frequency adjusting signal 24 of the device 22 to be driven rail-to-rail.

Therefore, when Vref1 is greater than Vref2, the signal 16 is inverted or output 180° out-of-phase by the inverter comprising transistors 226 and 228 to result in the frequency adjusting signal 24. In addition, the magnitude of the difference n=|Vref1–Vref2| is directly proportional to the amount of attenuation or amplification experienced by the signal 24 (See FIG. 6). Likewise, when Vref1 is less than Vref2, the signal 16 is passed to the output signal 24 without any change in phase (i.e. a 0° shift). In addition, the magnitude of the difference between the Vref1 signal and the Vref2 signal determines the amount of amplification or attenuation which will occur through the buffer comprising transistors 230 and 232 (see FIG. 7).

The output signal 24 from the frequency adjust stage 22 of FIG. 5 is provided to one terminal of the capacitor 200 of FIG. 4. A representation of signal 16 or a 180° phase-shifted version of a signal 16 is provided to a second terminal of capacitor 200. It is important to note that the phase of the Miller effect to the capacitor 200 depends upon whether the input 16 is taken from the input 32 or output 34 of FIG. 1 and provided to the stage 22. In one case, the signal difference between the input 32 and the signal 24 will be 0° or 180°. In the other case the difference between the input 32 and the signal 24 will be 180° or 360° (which is equivalent to 0°). Therefore, the Miller effect will function regardless of whether the input to stage 22 is taken from the input 32 or the output 34 wherein one embodiment is the inverse of the other embodiment.

Figure 6:
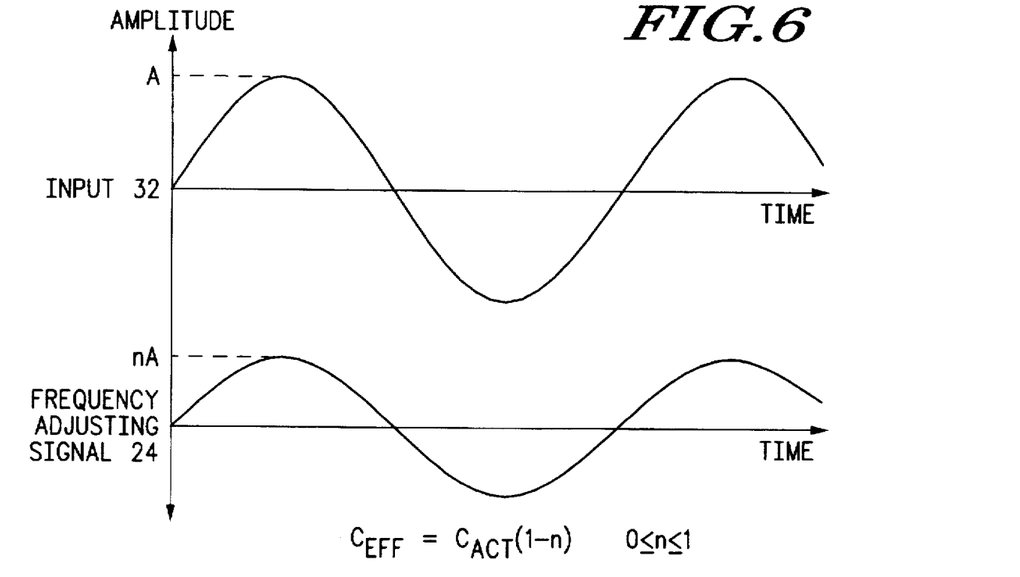
FIGS. 6 and 7 illustrate, in x-y plots, the use of Miller effect to change the effective capacitance of a capacitive element in accordance with the present invention.

FIG. 6 illustrates the input signal 32 from FIG. 4 which is coupled to a first terminal of the capacitor 200. FIG. 6 also illustrates the frequency adjusting signal 24 output from the frequency adjust stage 22 of FIGS. 4 and 5. As illustrated in FIG. 6, the signal 24 is in phase or zero-degree-shifted from the signal provided at input 32. The frequency adjusting stage 22 will either amplify or attenuate the signal 16 to provide the signal 24 as illustrated in FIG. 6. Therefore, when Vref1 (FIG. 4) is greater than Vref2, the frequency adjust signal 24 of FIG. 6 is can be represented as input signal 32 multiplied a gain factor n. In a preferred form, the value n in FIG. 6 is between 0 and 1, so that the effective capacitance of the capacitor 200 is positive. If the value of n in FIG. 6 is greater than 1, then amplification would be occurring and the effective capacitance of the capacitor 200 of FIG. 4 will be negative. A negative capacitance is not ideal in most embodiments, however, a negative capacitance can be used for other applications. Therefore, with $0 \leq n \leq 1$ in FIG. 6, the effective capacitance can be varied from 0 to Cact where Cact is the actual physical capacitance of the capacitor 200. From FIG. 6, the effective capacitance (Ceff) of the capacitor 200 which has an actual capacitance of Cact is Ceff=Cact(1−n).

Figure 7:
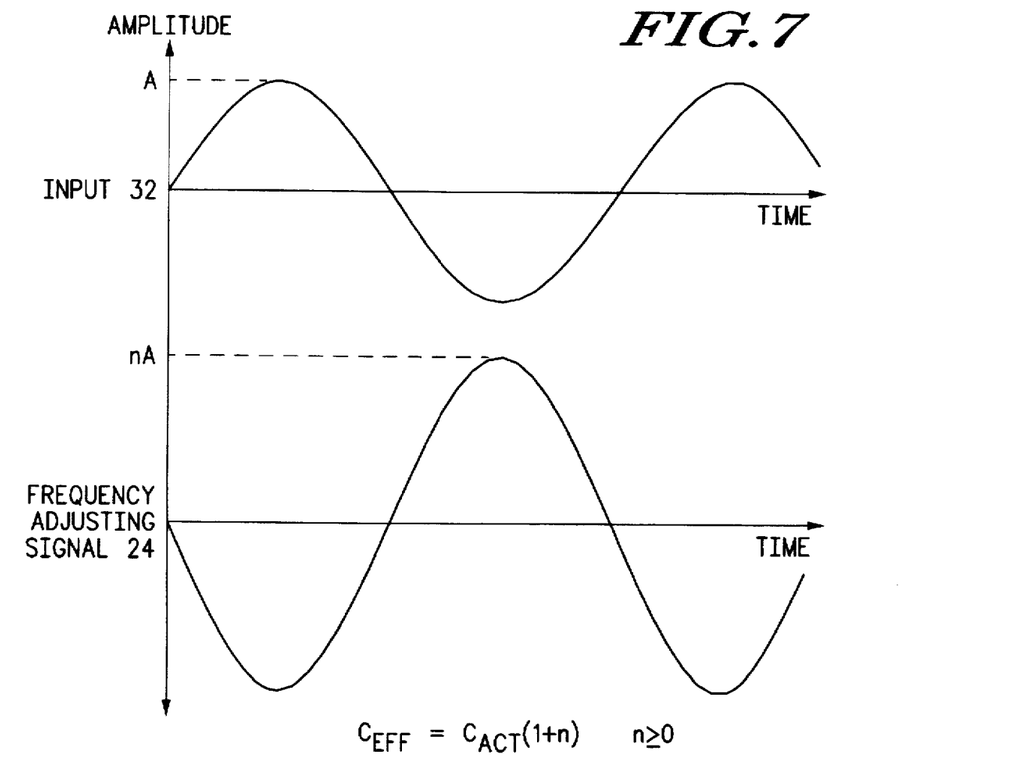

If the Vref1 and Vref2 signals of FIG. 6 are changed in polarity, so that Vref2 is greater than Vref1, then the waveforms illustrated in FIG. 7 apply. In FIG. 7, the signal 24 of the FIG. 4, which is provided by the frequency adjust stage 22 of FIG. 5, is 180° shifted or inverted with respect to the signal 32 of FIG. 4. The manner in which this inversion is performed was discussed in detail previously via FIG. 5 by using the transistors 226–232. In addition to performing an inversion or 180° shift of the signal 32, the frequency adjust stage 22 can either attenuate or amplify the signal 32 to result in the amplitude of the output signal 24. Therefore, the stage 22 can amplify or attenuate the input signal 32 via an amplitude/attenuation factor n.

FIG. 7 illustrates the specific case where n is equal to 2 so that the peak-to-peak amplitude of signal 24 is twice that of the signal 32. Therefore, the effective capacitance of the capacitor 200 is equal the actual capacitance multiplied by 1+n or Ceff=Cact(1+n). In this specific case of FIG. 7, n=2 resulting in the Ceff of the capacitor 200 being three times the actual physical capacitance (Cact) for the capacitor 200. If n is constrained so that $n \geq 0$, then the Ceff of FIG. 7 can be varied between Cact to theoretically infinite capacitance by increasing n towards infinity. Therefore, the non-inverting operation of FIG. 6 will allow for Miller effect altering of the Cact of capacitor 200 between 0 and Cact when $0 \leq n \leq 1$ in FIG. 6. In addition, the inverting operation illustrated in FIG. 7 will allow the Miller effect to change Ceff of the capacitor 200 from Cact to any value larger than Cact. In summary, by using the Miller effect, the capacitor 200 can be made to appear to be a capacitor having a capacitance anywhere between 0 and a near infinite Ceff for very high gain values of n.

Therefore, the use of 0° or 180° phase shifting along with attenuation and/or amplification can result in Miller shifting of the effective capacitance of the element 200 to result in frequency control of an oscillator 36.

The frequency adjust stage 22 is a preferred embodiment for a high frequency system operating above approximately 15 MHz. For lower frequency systems more traditional operational amplifier techniques can be used to implement the amplitude control and phase shift functions of the frequency adjust stage 22. In an embodiment utilizing an operational amplifier, the control signal 17 would represent feedback from the operational amplifier output, as well as external control information.

Figure 8:
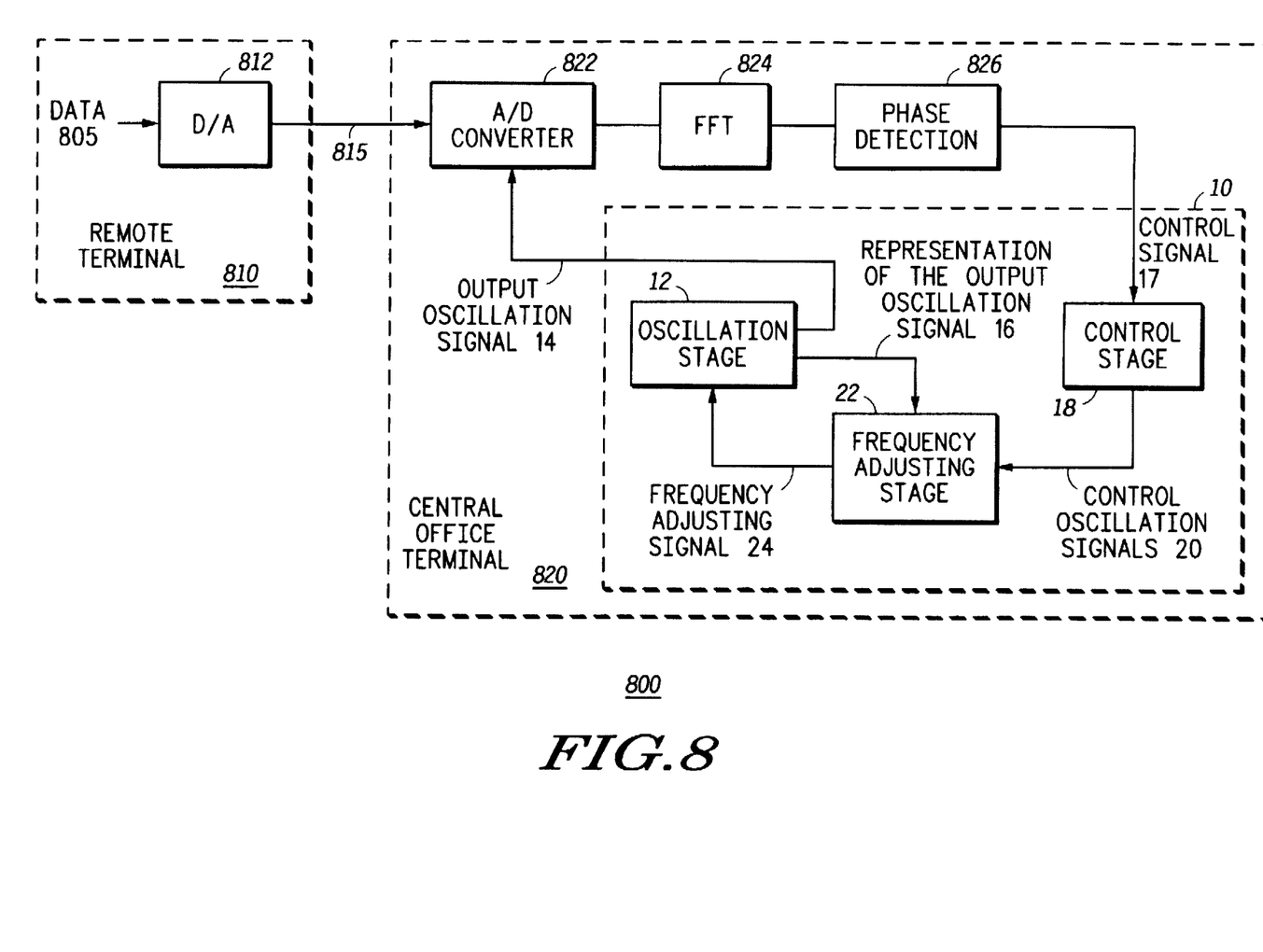
FIG. 8 illustrates, in a block diagram, an asymmetrical digital subscriber line (ADSL) system which uses the Miller effect to synchronize an ADSL receiver and an ADSL transmitter with each other in accordance with the present invention.

FIG. 8 illustrates a portion of an Asymmetric Digital Subscriber Line (ADSL) 800 containing the present inventions. The ADSL portion 800 comprises a remote terminal 810 connected to a central office terminal 820 via a transmission media 815. The transmission media is generally a twisted pair line.

The remote terminal 810 includes a digital to analog converter 812 for converting a digital data 805 to an analog signal of that signal. In order to synchronize the remote terminal 810 to the central office 820, a 69 KHz signal is included in the digital data 805 and transmitted to the central office via the transmission media 815. The central office terminal 820 utilizes the 69 KHz signal to synchronize to the remote terminal.

The central office terminal 820 comprises an analog-to-digital (A/D) converter connected to the transmission media 815, a fast Fourier Transform block (FFT) 824, a phase detection block 826, and the controlled oscillator circuit 10.

The A/D converter 822 receives and converts the analog signal containing the reference 69 KHz into a digital representation of the signal, as well as converting the output oscillation signal 14 from the controlled oscillation circuit 10. These digital representations are provided to the FFT 824. The FFT converts the digital signals from the time domain to the Frequency domain. The frequency domain information is provided to the phase detection circuit which determines if the oscillation signal and 69 KHz reference signal are in phase. Depending on the phase relationship, a control signal 17 is generated. The control signal 17 is received by the controlled oscillation detection circuit 10 in order to control the output oscillation signal 14 as previously discussed.

Thus it is apparent that there has been provided, in accordance with the present invention, a method and apparatus for controlling the reactance of a reactive component in order to control an oscillator. Although the invention has been described and illustrated with reference to the specific embodiment, it is not intended that the invention be limited to these illustrative embodiments. Those skilled in the art will recognize that modifications and variations may be made with departing from the spirit and scope of the invention. For example, the 69 KHz signal is not crucial and may be other values. Additionally, while Vref1 and Vref2 are taught herein, it is clear that one voltage reference may be used while the other voltage reference is fixed to either Vss or Vdd. While this does not give a full range of 6.6 volts of |Vref1−Vref2| when the maximal supply voltage is 3.3 volts, this embodiment will still provide some Miller effect control for the capacitor 200 taught herein. In addition, the capacitor 200 can be a fixed value capacitor or a variable capacitor, such as a varactor, in accordance with the present invention. Therefore, it is intended that this invention encompass all variations and modifications as fall within the scope of the appended claims.

It is to be understood, therefore, that this invention is not limited to the particular forms illustrated and that it is intended in the appended claims to cover all modifications that do not depart from the spirit and scope of this invention.

What is claimed is:

1. An electronic device comprising:

an oscillation stage capable of generating an output oscillation signal, the oscillation stage comprising an oscillation element having a first node and a second node, and a reactive element having a first node coupled to the first node of the oscillation element, and a second node of the reactive element having an actual reactance;

a frequency adjust stage having an input node for receiving a representation of the output oscillation signal, and an output node, wherein the frequency adjust stage is capable of processing the representation of the output oscillation signal to provide a frequency adjust signal at the output node, the frequency adjust signal capable of being phase shifted by one of approximately 0° and approximately 180° with respect to the representation of the output oscillation signal and being amplified; and whereby the frequency adjust stage output node is coupled to the second node of the reactive element for changing an effective reactance of the reactive element to a reactance different from the actual reactance, the effective reactance capable of affecting a frequency of the output oscillation signal.

2. The electronic device of claim 1, wherein the input node of frequency adjust stage is coupled to the first node of the oscillation element for receiving the representation of the output oscillation signal.

3. The electronic device of claim 1, wherein the input node of frequency adjust stage is coupled to the second node of the oscillation element for receiving the representation of the output oscillation signal.

4. The electronic device of claim 1, wherein the frequency adjust signal is capable of being amplified at an amplification value of approximately zero.

5. The electronic device of claim 1, wherein the frequency adjust stage further comprising an inverter having an input node coupled to the input node of the frequency adjust stage, and an output node coupled to the output node of the frequency adjust stage.

6. The electronic device of claim 5, wherein the frequency adjust stage further comprising a first voltage reference terminal coupled to the inverter and a second voltage reference terminal coupled to the inverter, wherein the first voltage reference terminal and second voltage reference terminal are capable of receiving a variable potential such that during a first time period the first voltage reference terminal has a potential greater than a potential of the second voltage reference terminal, and during a second time period the second voltage reference terminal has a potential greater than the potential of the second voltage reference terminal.

7. The electronic device of claim 6, wherein the frequency adjust stage further comprising a buffer having an input node coupled to the input node of the frequency adjust stage, and an output node coupled to the output node of the frequency adjust stage.

8. The electronic device of claim 7, wherein the frequency adjust stage further comprising a resistor having a first terminal coupled to the input node of the frequency adjust stage, and a second terminal coupled to the input node of the inverter.

9. The electronic device of claim 8, the frequency adjust stage further comprising a power down input coupled to the input node of the inverter and the input node of the buffer, wherein the frequency adjust stage is capable of entering a low power mode when the power down input is asserted.

10. An electronic device comprising:

an oscillation stage for providing an oscillation signal having a reactive element and an oscillator portion, wherein the reactive element has a first node coupled to the oscillator portion, and a second node;

an oscillator reference terminal coupled to the oscillation stage for providing a representation of the oscillation signal;

a first inverter having an input terminal coupled to the oscillator reference terminal, an output terminal coupled to the second node of the reactive element, a first power supply terminal coupled to receive a first voltage reference, and a second power supply terminal coupled to receive a second voltage reference; and a buffer having an input coupled to the oscillator reference terminal for receiving an inverted representation of the oscillation signal, an output coupled to the output of the first inverter, a first power supply terminal coupled to receive the first voltage reference, and a second power supply terminal coupled to receive the second voltage reference.

11. The electronic device of claim 10, wherein the oscillator portion of the oscillation stage further comprises:

an oscillator element having a first terminal coupled to the first terminal of the reactive element, and a second terminal;

a second inverter having a first terminal coupled to the first terminal of the oscillator element, and a second terminal coupled to the second terminal of the oscillator element; and a resistive element having a first terminal coupled to the first terminal of the oscillator element and a second terminal coupled to the second terminal of the oscillator element.

12. The electronic device of claim 11 wherein the oscillator reference terminal is coupled to the first terminal of the oscillator element.

13. The electronic device of claim 11, wherein the oscillator reference terminal is coupled to the second terminal of the oscillator element.

14. The electronic device of claim 10, wherein there is a Miller effect created across the reactive element.

15. The electronic device of claim 14, wherein the Miller effect created across the reactive element can be controlled.

16. The electronic device of claim 15, wherein the Miller effect is controlled by varying at least one of the first voltage reference and the second voltage reference.

17. An electronic circuit comprising:

an oscillation element having a first terminal which provides an first oscillation signal and a second terminal which provides a second oscillation signal;

a reactive element having a first terminal and a second terminal, wherein the first terminal is coupled to one of either the first terminal and the second terminal of the oscillation element; and a first circuit element having a first terminal coupled to one of either the first terminal or the second terminal of the oscillation element in order to receive an input signal having an amplitude A, and a second terminal coupled to the second terminal of the reactive element, wherein the first circuit element provides an output signal to the second terminal having a phase that is approximately 0° out of phase with a signal present on the first terminal of the reactive element, and the output signal capable of being amplified to an amplitude of approximately $A(n)$ wherein n comprises a range of $0<n<1$, wherein a Miller effect occurs on the reactive element.

18. An electronic circuit comprising:

an oscillation element having a first terminal which provides an first oscillation signal and a second terminal which provides a second oscillation signal;

a reactive element having a first terminal and a second terminal, wherein the first terminal is coupled to one of either the first terminal and the second terminal of the oscillation element; and a first circuit element having a first terminal coupled to one of either the first terminal or the second terminal of the oscillation element in order to receive an input signal having an amplitude A, and a second terminal coupled to the second terminal of the reactive element, wherein the first circuit element provides an output signal to the second terminal having a phase that is approximately 180° out of phase with a signal present on the first terminal of the reactive element, and the output signal capable of being amplified to an amplitude of approximately $A(n)$ wherein n comprises a range of 0<n, wherein a Miller effect occurs on the reactive element.

19. An Asymmetric Digital Subscriber line system comprising:

an analog to digital converter capable of receiving an analog signal comprising a reference signal, and capable of providing a digital representation of the analog signal;

a controlled oscillation stage having a control signal input terminal for receiving a control signal, and an output terminal for providing an oscillation signal, wherein the control signal is capable of controlling oscillation signal by adjusting an effective reactance of a reactive device by varying a potential on a first and second terminal of the reactive device;

a time to frequency domain converter capable of converting the digital representation of the analog signal and the oscillation signal from a time domain to a frequency domain; and a phase detection stage coupled to the time to frequency domain converter, where in the phase detection stage is capable of generating the control signal based on a frequency domain representation of the reference signal and the oscillation signal.

20. The electronic device of claim 18 wherein the reactive element is a capacitor.

21. The electronic device of claim 20, wherein the reactive element is a non-variable capacitor.

22. The electronic device of claim 18 wherein the reactive element is a varactor.

23. The electronic device of claim 18, wherein the reactance value of the reactive element is a capacitance value.

24. An electronic device comprising:

a first transistor of a first conductivity type having a gate coupled to an input terminal, a first current electrode coupled to a first voltage reference terminal capable of receiving a first voltage potential, a second current electrode coupled to an output terminal, and a bulk electrode coupled to a second voltage reference terminal capable of receiving a second voltage potential;

a second transistor of a second conductivity type having a gate coupled to the input terminal, a first current electrode coupled to the second current electrode of the first transistor, a second current electrode coupled to a third voltage reference terminal capable of receiving a third voltage potential, and a bulk electrode coupled to a fourth voltage reference terminal capable of receiving a fourth voltage potential;

a third transistor of a second conductivity type having a gate coupled to the input terminal, a first current electrode coupled to the first voltage reference terminal, a second current electrode coupled to the output terminal, and a bulk electrode coupled to the fourth voltage reference terminal; and a fourth transistor of a first conductivity type having a gate coupled to the input terminal, a first current electrode coupled to the second current electrode of the third transistor, a second current electrode coupled to the third voltage reference terminal, and a bulk electrode coupled to a second voltage reference terminal.

25. The electronic device of claim 24 wherein the gate of the third transistor and the gate of the fourth transistor are coupled in series to the input terminal through a first inverter.

26. The electronic device of claim 25 further comprising a first resistor having a first terminal coupled to the gate of the first transistor, and a second terminal coupled to the output terminal.

27. The electronic device of claim 27 further comprising:

a fifth transistor having a gate coupled to a power down terminal capable of receiving a power down signal, a first current electrode coupled to an input of the first inverter, a second current electrode coupled to the fourth voltage reference terminal, and a bulk terminal coupled to the fourth voltage reference terminal;

a second inverter having an input coupled to the power down terminal, and an output; and a sixth transistor having a gate coupled to the output of the second inverter, a first current electrode coupled to the second voltage reference terminal, a second current electrode coupled to the gate of the first transistor, and a bulk electrode coupled to the second voltage reference terminal.

28. The electronic device of claim 27 further comprising a second resistor having a first terminal coupled the input of the first inverter, and a second terminal coupled to an output terminal of the second inverter.

29. The electronic device of claim 25, wherein the electronic device is capable of operation when the first voltage potential is one of a potential greater than the third voltage potential and a potential less than the third voltage potential.

30. The electronic device of claim 24, wherein the first voltage potential is substantially equal to the second voltage potential.

31. The electronic device of claim 24, wherein the third voltage potential is substantially equal to the fourth voltage potential.

* * * * *